United States Patent
Lu et al.

(10) Patent No.: US 9,634,154 B1
(45) Date of Patent: Apr. 25, 2017

(54) SCHOTTKY DIODE HAVING A WELL WITH PERIPHERIAL CATHOD REGIONS AND CENTER ANDOE REGION

(71) Applicant: TAIWAN SEMICONDUCTOR MANUFACTURING COMPANY LTD., Hsinchu (TW)

(72) Inventors: Hui-Ting Lu, Hsinchu County (TW); Yu-Chang Jong, Hsinchu (TW); Pei-Lun Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/928,643

(22) Filed: Oct. 30, 2015

(51) Int. Cl.
| | |
|---|---|
| H01L 29/87 | (2006.01) |
| H01L 29/06 | (2006.01) |
| H01L 29/66 | (2006.01) |
| H01L 29/872 | (2006.01) |
| H01L 21/761 | (2006.01) |
| H01L 21/762 | (2006.01) |

(52) U.S. Cl.
CPC .......... H01L 29/872 (2013.01); H01L 21/761 (2013.01); H01L 21/76224 (2013.01); H01L 29/0638 (2013.01); H01L 29/0646 (2013.01); H01L 29/0649 (2013.01); H01L 29/66143 (2013.01)

(58) Field of Classification Search
CPC ............... H01L 29/872; H01L 29/0638; H01L 29/0646; H01L 29/0649; H01L 29/66143
See application file for complete search history.

(56) References Cited

U.S. PATENT DOCUMENTS

| | | | | |
|---|---|---|---|---|
| 6,768,139 B2* | 7/2004 | Fischer | ............... | H01L 29/7327 257/185 |
| 7,138,701 B2* | 11/2006 | Pequignot | ........... | H01L 27/0255 257/173 |
| 9,059,008 B2* | 6/2015 | Lin | .................... | H01L 29/66356 |
| 9,212,992 B2* | 12/2015 | McNutt | .................. | G01N 21/55 |
| 9,401,355 B2* | 7/2016 | Weyers | ............... | H01L 27/0814 |
| 2002/0130390 A1* | 9/2002 | Ker | ...................... | H01L 27/0255 257/546 |
| 2004/0217425 A1* | 11/2004 | Brodsky | ............. | H01L 27/0248 257/360 |
| 2007/0278608 A1* | 12/2007 | Shim | ..................... | H01L 29/417 257/481 |
| 2009/0179222 A1* | 7/2009 | Ker | ..................... | H01L 27/0262 257/119 |
| 2011/0272561 A1* | 11/2011 | Sanfilippo | ........... | H01L 27/1446 250/214.1 |
| 2013/0193546 A1* | 8/2013 | Webster | .............. | H01L 27/1443 257/438 |
| 2014/0061731 A1* | 3/2014 | Chen | ..................... | H01L 29/872 257/272 |

* cited by examiner

*Primary Examiner* — Ida M Soward
(74) *Attorney, Agent, or Firm* — WPAT, P.C., Intellectual Property Attorneys; Anthony King; Kay Yang (57) ABSTRACT

In some embodiments, a semiconductor device includes a first well region configured to be an anode of the semiconductor device, a first doped region configured to be a cathode of the semiconductor device, a second doped region configured to be another cathode of the semiconductor device, and a conductive region. The first well region is disposed between the first doped region and the second doped region, and is configured for electrical connection of the conductive region.

19 Claims, 10 Drawing Sheets

SCHOTTKY DIODE HAVING A WELL WITH PERIPHERIAL CATHOD REGIONS AND CENTER ANDOE REGION

BACKGROUND

Applying a metal layer to a surface of a doped semiconductor material, e.g., a layer enriched or depleted of carrier charges, creates a contact region having properties comparable to a p-n junction in a semiconductor material. The common name for this metal-semiconductor contact region is a Schottky diode. The ability of Schottky diodes to substantially restrict current flow to one direction is a property heavily relied upon in the manufacture and design of integrated circuits. When forward biased, a Schottky diode is in an "on" state and current flows through the diode. When the diode is reverse biased, a Schottky diode is in an "off" state and ideally will not allow current to flow.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
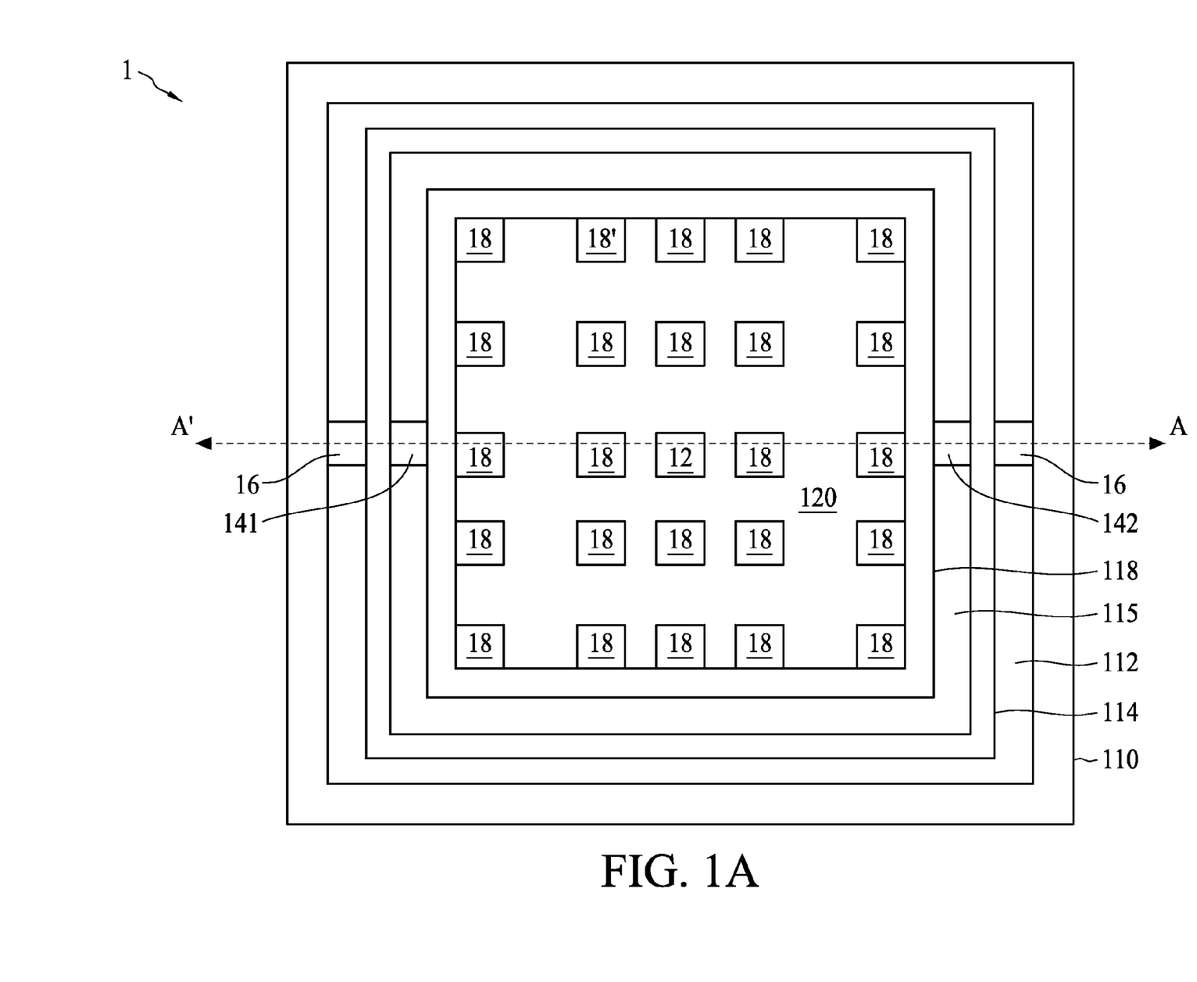
FIG. 1A is a layout top view of a semiconductor device, in accordance with some embodiments of the present disclosure.

FIG. 1A is a layout top view of a semiconductor device 1, in accordance with some embodiments of the present disclosure. Referring to FIG. 1A, the semiconductor device 1 includes a first region 120 and a second region 115. For example, the first region 120 is an anode region and the second region 115 is a cathode region in an embodiment that the semiconductor device 1 serves as a Schottky diode.

The first region 120 is defined by an isolation structure 118 such as a shallow trench isolation (STI) structure. The first region 120 includes a first well region 12, and a plurality of well regions 18.

The first well region 12 is substantially disposed at a center portion of the first region 120. Moreover, the first well region 12 is a semiconductor well of a first dopant type. In an embodiment, the first dopant type is p type. Moreover, the first well region 12 is a deep p-well. In the present embodiment, the first well region 12 serves as an anode for the semiconductor device 1. A pickup AN (shown in FIG. 1B) is formed on the first well region 12 in a patterned conductive layer (not shown) for electrical connection.

In the present embodiment, the plurality of well regions 18 is disposed substantially symmetrically with respect to the first well region 12. Each of the plurality of well regions 18 is a semiconductor well of the first dopant type. In the present embodiment, the plurality of well regions 18 also serves as anode for the semiconductor device 1.

The second region 115 is defined between the isolation structure 118 and an isolation structure 114 such as an STI structure. The second region 115 includes a first doped region 141 and a second doped region 142. For brevity and convenience, only two doped regions 141 and 142 are shown in FIG. 1A, while the second region 115 may include a plurality of such doped regions. The first doped region 141 and the second doped region 142 are disposed symmetrically with respect to the first well region 12. The second region 115 (i.e., the cathode region) substantially surrounds the first region 120 (the anode region).

The first doped region 141 includes dopant of a second dopant type opposite to the first dopant type. In an embodiment, the second dopant type is an n-type. Furthermore, the first doped region 141 is a heavily doped n-type region. In the present embodiment, the first doped region 141 serves as a cathode for the semiconductor device 1. A pickup CA1 (shown in FIG. 1B) is formed on the first doped region 141 in the patterned conductive layer for electrical connection.

Likewise, the second doped region 142 includes dopant of the second dopant type. Moreover, the second doped region 142 is a heavily doped n-type region. In the present embodiment, the second doped region 142 also serves as a cathode for the semiconductor device 1. A pickup CA2 (shown in FIG. 1B) is formed on the second doped region 142 in the patterned conductive layer for electrical connection.

Moreover, a well region 112 is defined between the isolation structure 114 and an isolation structure 110 which also includes an STI structure. In an embodiment, the well region 112 is a semiconductor well of the first dopant type. Furthermore, the well region 112 is a heavily doped p-well. The well region 112 has a plurality of third doped regions 16 therein. For brevity and convenience, only two third doped regions 16 are shown in FIG. 1A.

Each of the plurality of third doped regions 16 includes dopant of the first dopant type. Moreover, each of the plurality of third doped regions 16 is a heavily doped p-type region. The third doped region 16 includes a pickup for electrical connection of the well region 112. The third doped region 16 is electrically isolated from the first doped region 141 and the second doped region 142 by the isolation structure 114. Further, the plurality of third doped regions 16 and the well 112 are configured for electrical connection of the substrate 122.

With the first well region 12 disposed at the center region of the first region 120 (anode region), there is no need to reserve an area elsewhere for placing the first well region 12, and therefore the area cost of the semiconductor device 1 is significantly reduced. For example, assume the area of the first region 120 is called total area and the area of the first region 120 excluding the first well region 12 is called effective area. In an embodiment, the ratio of the effective area to the total area is up to approximately 93.8%.

In some existing semiconductor devices, a well region analogous to the first well region 12 is not placed at a center region of the first region 120. Instead, two or more such well regions are placed externally to an anode region analogous to the first region 120 where well regions 18 are disposed. Moreover, the well regions analogous to the first well region 12 are not configured to serve as anodes. Accordingly, an additional area is required for the well regions analogous to the first well region 12. As a result, an area cost of the existing semiconductor devices is relatively high as compared to the semiconductor device 1. For example, the ratio of an effective area to a total area in the existing semiconductor devices is only approximately 64%, which is significantly lower than the 93.8% of the semiconductor device 1.

Figure 1B:
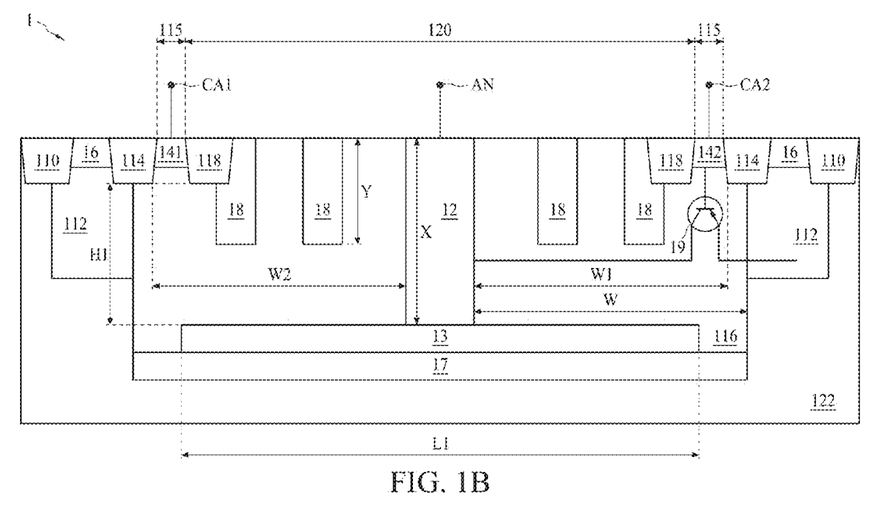
FIG. 1B is a cross-sectional view of the semiconductor device shown in FIG. 1A taken along a line A-A', in accordance with some embodiments of the present disclosure.

FIG. 1B is a cross-sectional view of the semiconductor device 1 shown in FIG. 1A taken along a line A-A', in accordance with some embodiments of the present disclosure. Referring to FIG. 1B, the first well region 12, the first doped region 141, the second doped region 142, the third doped region 16 in the substrate 122, and a well 116, a conductive region 13 and another conductive region 17 in the substrate 122 are illustrated.

The well region 18 has a depth of Y. The first well region 12 serves as an anode of the semiconductor device 1, and has an associated pickup "AN". In addition, the first well region 12 has a depth of X. Moreover, the first well region 12, configured for electrical connection of the conductive region 13, is contiguous with the conductive region 13. Since the conductive region 13 is formed under the well regions 18, the depth X of the first well region 12 is longer than the depth Y of the well region 18.

Additionally, the first well region 12 is defined between the first doped region 141 and the second doped region 142. In some embodiments, the first well region 12 is substantially equally distant from the first doped region 141 and second doped region 142. As a result, the distance W2 from the first well region 12 to the first doped region 141 is equal to the distance W1 from the first well region 12 to the second doped region 142. Consequently, parasitic resistance between the first well region 12 and the first doped region 141 is substantially equal to that between the first well region 12 and the second doped region 142, resulting in better performance of the semiconductor device 1.

The first doped region 141 and the second doped region 142 are disposed in the cathode region 150. Specifically, the first doped region 141 serves as a first cathode of the semiconductor device 1, and has an associated pickup "CA1". Similarly, the second doped region 142 serves as a second cathode of the semiconductor device 1, and has an associated pickup "CA2".

In some embodiments, the substrate 122 is slightly doped with a dopant of the first dopant type, and is set to a reference ground voltage. In some embodiments, the substrate 122 includes silicon germanium, gallium arsenic, silicon carbon, or other suitable semiconductor materials. In some embodiments, the substrate 122 further includes doped regions such as a P-well and an N-well (not shown). In some other embodiments, the substrate 122 further includes other features such as a buried layer, or an epitaxy layer. Furthermore, in some embodiments, the substrate 122 is semiconductor on insulator such as silicon on insulator (SOI). In other embodiments, the semiconductor substrate 122 includes a doped epi layer, a gradient semiconductor layer, or further includes a semiconductor layer overlying another semiconductor layer of a different type such as a silicon layer on a silicon germanium layer. In some other examples, a compound semiconductor substrate includes a multilayer silicon structure or a silicon substrate may include a multilayer compound semiconductor structure. In some embodiments, the substrate 122 may include other elementary semiconductors such as germanium and diamond. In some embodiments, the substrate 122 includes a compound semiconductor such as silicon carbide, gallium arsenide, indium arsenide, or indium phosphide.

In an embodiment the well 116 is a semiconductor well of the second dopant type and thus forms an n-well. The well 116 serves as an active region of the semiconductor device 1. The first well region 12, the first doped region 141, the second doped region 142, and the plurality of well regions 18 are formed in the well 116.

In an embodiment the conductive region 13 includes dopant of the first dopant type and thus forms a p-type region. Moreover, the conductive region 13 is formed as a buried layer contiguous with the first well region 12, and has a length L1 in the lateral direction. The conductive region 13 is configured to be in electrical contact with the first well region 12. In this way, a voltage can be applied to the conductive region 13 via the first well region 12. Moreover, the conductive region 13 substantially extends in the well 116 under the first doped region 141 and the second doped region 142. Furthermore, a distance between the conductive region 13 and the isolation structure 118 is H1.

The conductive region 17 includes dopant of the second dopant type and thus forms an n-type region. Moreover, the conductive region 17 is formed under the conductive region 13 and contiguous with the conductive region 13, and is configured to be in electrical contact with the conductive region 13. The conductive region 17 is configured to isolate the well 116 from the substrate 122. Moreover, the conductive region 17 and the conductive region 13 determine a breakdown voltage of the semiconductor device 1, which will be described in detail.

As previously discussed, in some embodiments the substrate 122 is a p-type substrate, the conductive region 17 is an n-type region, the conductive region 13 is a p-type region, the well 116 is an n-well, the first well region 12 is a p-type well region, the first and second doped region 141 and 142 are n-type regions, the plurality of well regions 18 is a p-well region, the well region 112 is a p-type region and the plurality of third doped regions 16 is a p-type region. Given the above, in operation, when a first voltage level is applied to the first well region 12 and to the plurality of well regions 18, while a second voltage level lower than the first voltage level is applied to the well 116 via the first doped region 141 and the second doped region 142, a forward bias condition occurs and the semiconductor is forward biased.

Due to the opposite dopant types between the conductive region 13 and the conductive region 17, a depletion region (not shown) exists at an interface therebetween. The depletion region is a factor of the breakdown voltage of the semiconductor device 1. Similarly, due to the opposite dopant types between the conductive region 17 and the substrate 112, another depletion region (not shown) exists at an interface therebetween. The other depletion region is also a factor of the breakdown voltage of the semiconductor device 1.

When the semiconductor 1 is forward biased, electric current flows from the first well region 12 (anode) toward the first doped region 141 (cathode) and the second doped region 142 (cathode). Due to the opposite dopant types between the plurality of well regions 18 and the well 116, the well regions 18 and the well 116 produce current that contributes to the resultant electric current. In a similar way, due to the opposite dopant types between the first well region 12 and the well 116, the first well region 12 and the well 116 also produce current that contributes to the resultant electric current. Moreover, since the depth X of the first well region 12 is longer than the depth Y of the well regions 18, current flowing through the first well region 12 is larger than that through any of the well regions 18. In some embodiments, even though not placed in the center region, if the first well region 12 configured for electrical connection of the conductive region 13 is placed among the well regions in the well 116, current of the semiconductor device 1 can still increase.

In the above-mentioned existing semiconductor devices, a well region (analogous to the first well region 12) is configured for electrical connection of a conductive layer (analogous to the conductive layer 13) and does not serve as an anode. Moreover, the well region (analogous to the first well region 12) is not placed in a well (analogous to the well 116) where well regions (analogous to the well regions 18) are placed. Therefore, the well region (analogous to the first well region 12) and the well (analogous to the well 116) produce no current when the existing semiconductor devices are forward biased. As a result, current of the existing semiconductor devices is relatively small.

In still a similar way, due to the opposite dopant types between the conductive region 13 and the well 116, the conductive region 13 and the well 116 produce current that contributes to the resultant electric current.

In the above-mentioned existing semiconductor devices, a well region (analogous to the first well region 12) configured for electrical connection of a conductive region (analogous to the conductive region 13) is not placed in a well (analogous to the well 116) where well regions (analogous to the well regions 18) are placed. Therefore, the conductive region (analogous to the conductive region 13) produces no current when the existing semiconductor devices are forward biased. As a result, current of the existing semiconductor devices is relatively small.

On the other hand, in the present disclosure since the first well region 12 configured for electrical connection of the conductive layer 13 is placed in the well 116, the well 116 (and the first doped region 141 and the second doped region 142) is further configured for electrical connection of the conductive layer 17. As a result, there is no need to additionally reserve an area for placing a well region only for electrical connection of the conductive layer 17. Effectively, the area cost of the semiconductor device 1 is further reduced.

In the above-mentioned existing semiconductor devices, since a well region configured for electrical connection of a first conductive region (analogous to the conductive region 13) is not placed in a well (analogous to the well 116) where well regions (analogous to the well regions) are placed, and since the first conductive region (analogous to the conductive region 13) and a second conductive region (analogous to the conductive region 17) are required to be biased at different voltage levels, there is a need to reserve an area for electrical connection of the second conductive region (analogous to the conductive region 17). As a result, the existing semiconductor devices consume a relatively large area.

Due to the dopant types among the first well region 12, the well 116 and the well 112, an undesired parasitic bipolar junction transistor (BJT) 19 is defined. For brief and convenience, only the parasitic BJT 19 is shown in FIG. 1B. The parasitic BJT 19 may mean a leakage path to the substrate 122, which would adversely affect the performance of the semiconductor device 1. One factor of the leakage current of the BJT 19 is the width W of the well 116. Specifically, the undesired leakage current increases as the width W decreases. Generally, the width of a well (such as the well 116) that may lead to the leakage current is relatively wide, so that the leakage current can be suppressed.

In the above-mentioned existing semiconductor devices, a first region (analogous to the first well region 12) configured for electrical connection of a first conductive region (analogous to the conductive region 13) is a p-well. A second region configured for electrical connection of a second conductive region (analogous to the conductive region 17) is an n-well. Moreover, a third region configured for electrical connection of a substrate (analogous to the substrate 112) is a p-well. Due to the dopant types among the first region, the second region and the third region, a parasitic BJT is defined by the first region, the second region and the third region. As previously discussed, a factor of the leakage current of the parasitic BJT is the width of the second region. However, the width of the second region configured for electrical connection is significantly smaller than that of a well configured for conduction of current when a semiconductor device is forward biased. Therefore, leakage current of the existing semiconductor devices resulting from the parasitic BJT is relatively large.

Since the first well region 12 is placed in the well 116 where the well regions 18 are placed, the first well region 12 can provide current when the semiconductor device 1 is forward biased. Moreover, since the conductive region 13 is in electric contact with the first well region 12 placed in the well 116 where the well regions 18 are placed, the conductive region 13 can also provide current when the semiconductor device 1 is forward biased. Furthermore, since the first well region 12 is placed in the well 116 where the well regions 18 are placed, the leakage current resulting from the parasitic BJT 19 decreases. In addition, since the first well region 12 is placed between the first doped region 141 and the second doped region 142, there is no need to reserve any area for a well region that would otherwise be configured for electrical connection of the conductive region 13, or any area for a well region that would otherwise be configured for electrical connection of the conductive region 17. Effectively, the semiconductor device 1 consumes a relatively small area.

Figure 2:
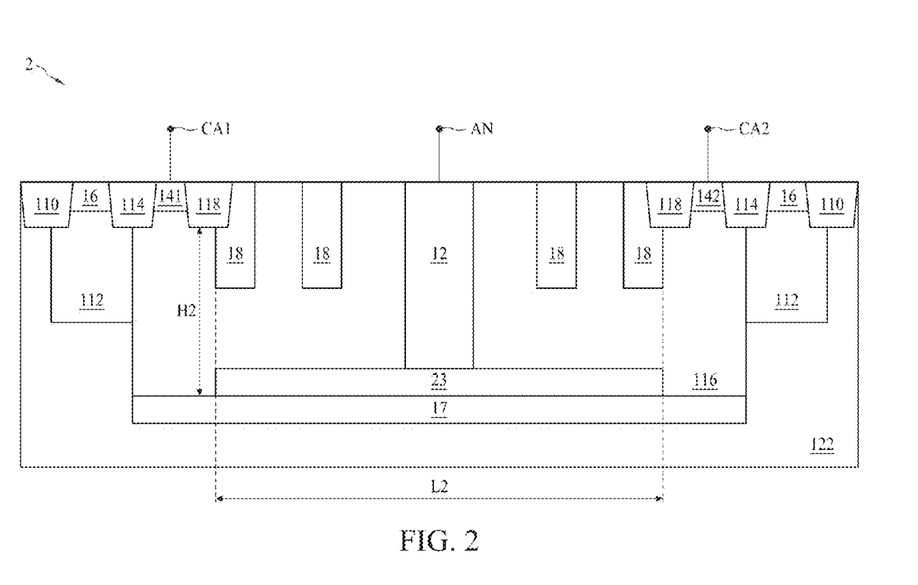
FIG. 2 is a diagram of a semiconductor device, in accordance with some embodiments of the present disclosure.

FIG. 2 is a diagram of a semiconductor device 2, in accordance with some embodiments of the present disclosure. Referring to FIG. 2, the semiconductor device 2 is similar to the semiconductor device 1 described and illustrated with reference to FIG. 1B except that, for example, the semiconductor device 2 replaces the conductive region 13 with a conductive region 23. Moreover, the conductive region 23 is similar to the conductive region 13 described and illustrated with reference to FIG. 1B except that, for example, the conductive region 23 has a length of L2 shorter than the length L1 of the conductive region 13. The conductive region 23 is disposed under the well regions 18 defined by the isolation structure 118. Moreover, the conductive region 23 extends across the well regions 18 without exceeding the isolation structure 118. As a result, the distance between the isolation structure 118 and the conductive region 17 is H2, longer than H1 in the semiconductor device 1.

The distance between the isolation structure 118 and the conductive region 17 is also a factor to determine electric current from the first well region 12 (anode) to first doped regions 141 and 142 (cathodes). Specifically, the electric current increases as the distance between the isolation structure 118 and the conductive region 17 increases. Since the distance at issue H2 in the semiconductor device 2 is longer that H1 in the semiconductor device 1, when the semiconductor devices 1 and 2 are forward biased, the semiconductor device 2 produces more current than the semiconductor device 1.

For the similar reasons as provided in the embodiment of FIG. 1B, since the first well region 12 is placed in the well 116 where the well regions 18 are placed, the first well region 12 can produce current when the semiconductor device 1 is forward biased. Moreover, since the first well region 12 is placed in the well 116 where the well regions 18 are placed, the conductive region 23 can also produce current when the semiconductor device 1 is forward biased. Furthermore, since the first well region 12 is placed in the well 116 where the well regions 18 are placed, leakage current resulting from the parasitic BJT 19 decreases. In addition, since the first well region 12 is placed between the first doped region 141 and the second doped region 142, there is no need to reserve any area for a well region that would otherwise be configured for electrical connection of the conductive region 23, or any area for a well region that would otherwise be configured for electrical connection of the conductive region 17. Effectively, the semiconductor device 2 consumes a relatively small area.

Figure 3A:
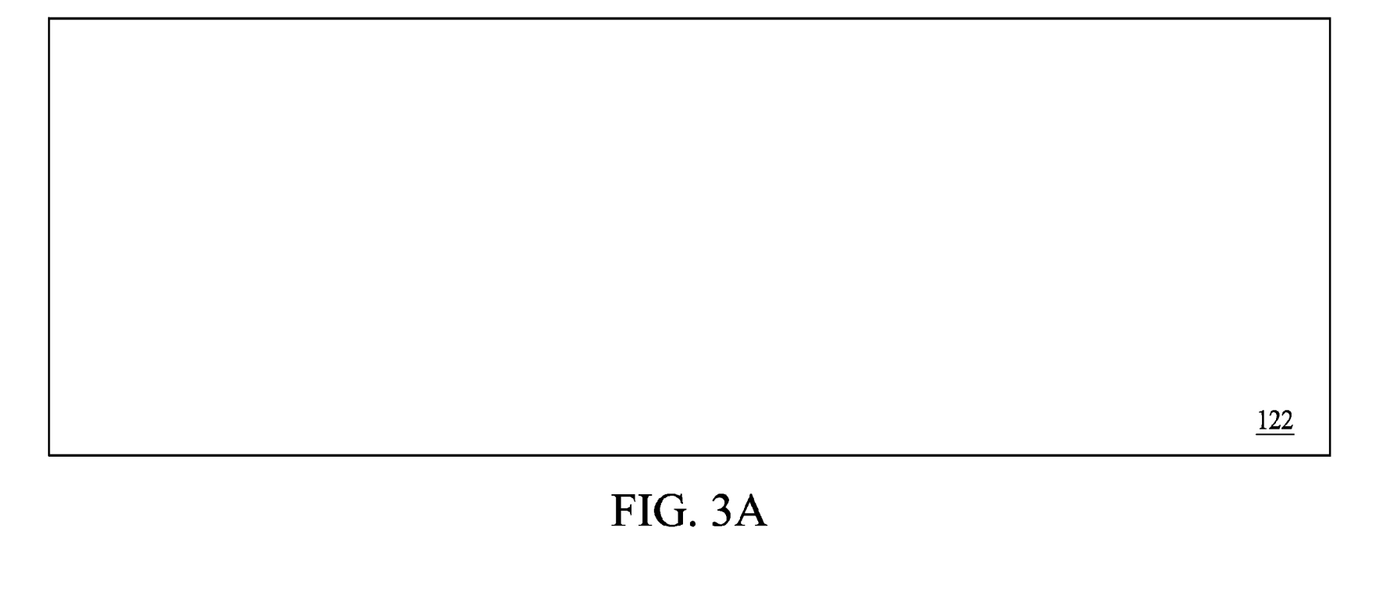
FIGS. 3A to 3F are diagrams showing a method of manufacturing a semiconductor device, in accordance with some embodiments of the present disclosure.

FIGS. 3A to 3F are diagrams showing a method of manufacturing a semiconductor device, in accordance with some embodiments of the present disclosure. Referring to FIG. 3A, a substrate 122 is provided. In some embodiments, the substrate 122 includes a p-type dopant.

Figure 3B:
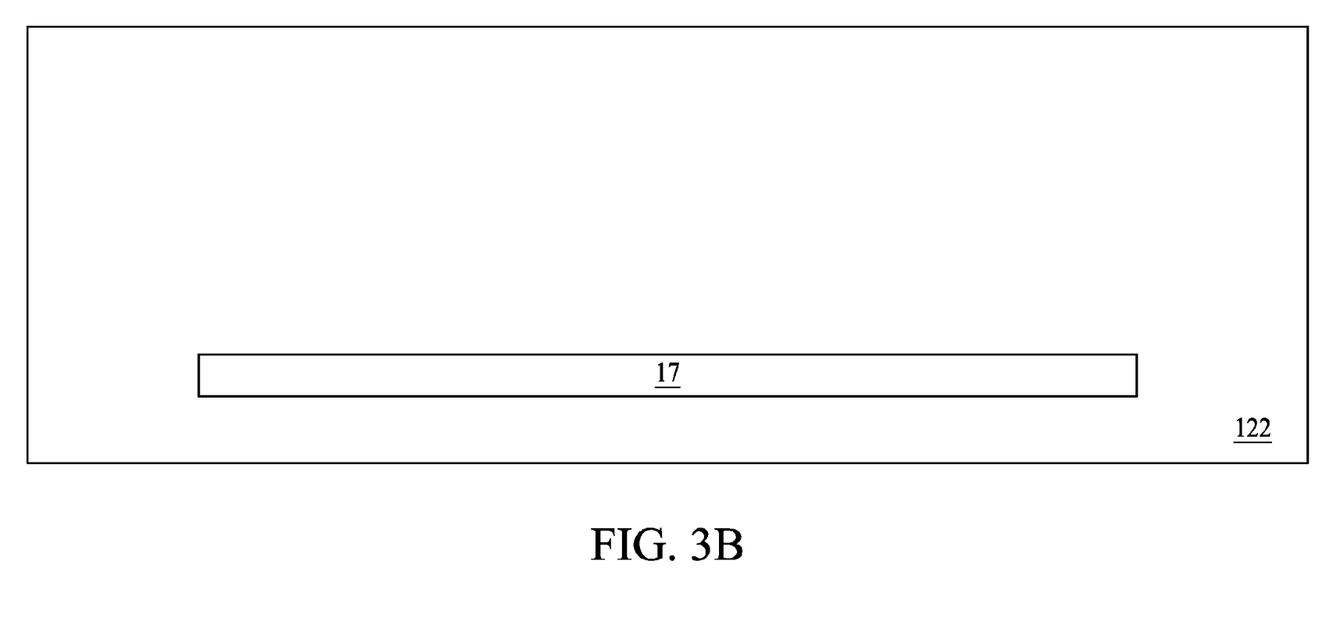

Referring to FIG. 3B, a conductive region 17 is defined in the substrate 122 by, for example, an implant process to implant an n-type dopant.

Figure 3C:
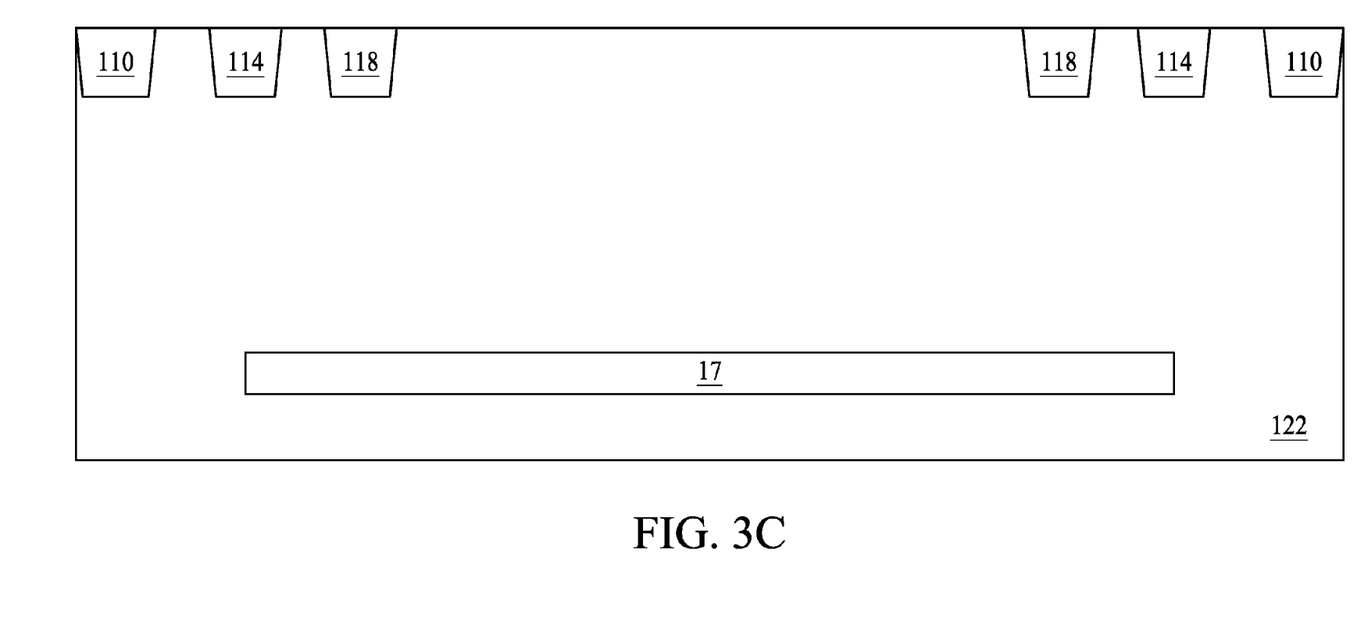

Referring to FIG. 3C, isolation structures 110, 114 and 118 are formed in the substrate 122 by, for example, a deposition process, an etching process, a pullback process, an annealing process and a chemical mechanical planarization process sequentially performed in order. In an embodiment, the isolation structures 110, 114 and 118 include an STI structure. Moreover, the isolation structure 118 is substantially surrounded by the isolation structure 114, which in turn is substantially surrounded by the isolation structure 110.

Figure 3D:
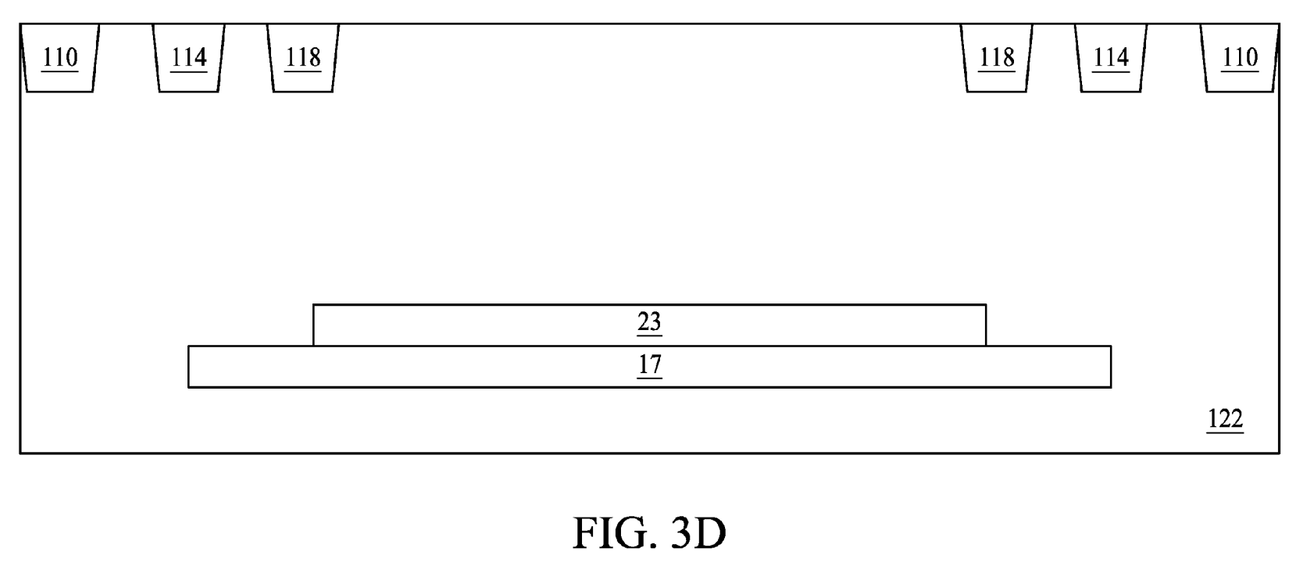

Referring to FIG. 3D, a conductive region 23 is formed in the substrate 122 by, for example, an ion implantation process followed by a drive-in process. In particular, the implant depth is well controlled such that the conductive region 23 is formed over the conductive region 17 and contiguous with the conductive region 17. Moreover, in the present embodiment, the conductive region 23 is disposed under an area defined by the isolation structure 118 without exceeding the isolation structure 118. However, in some embodiments, the conductive region 23 is disposed under an area defined by the isolation structure 114 without exceeding the isolation structure 114.

Figure 3E:
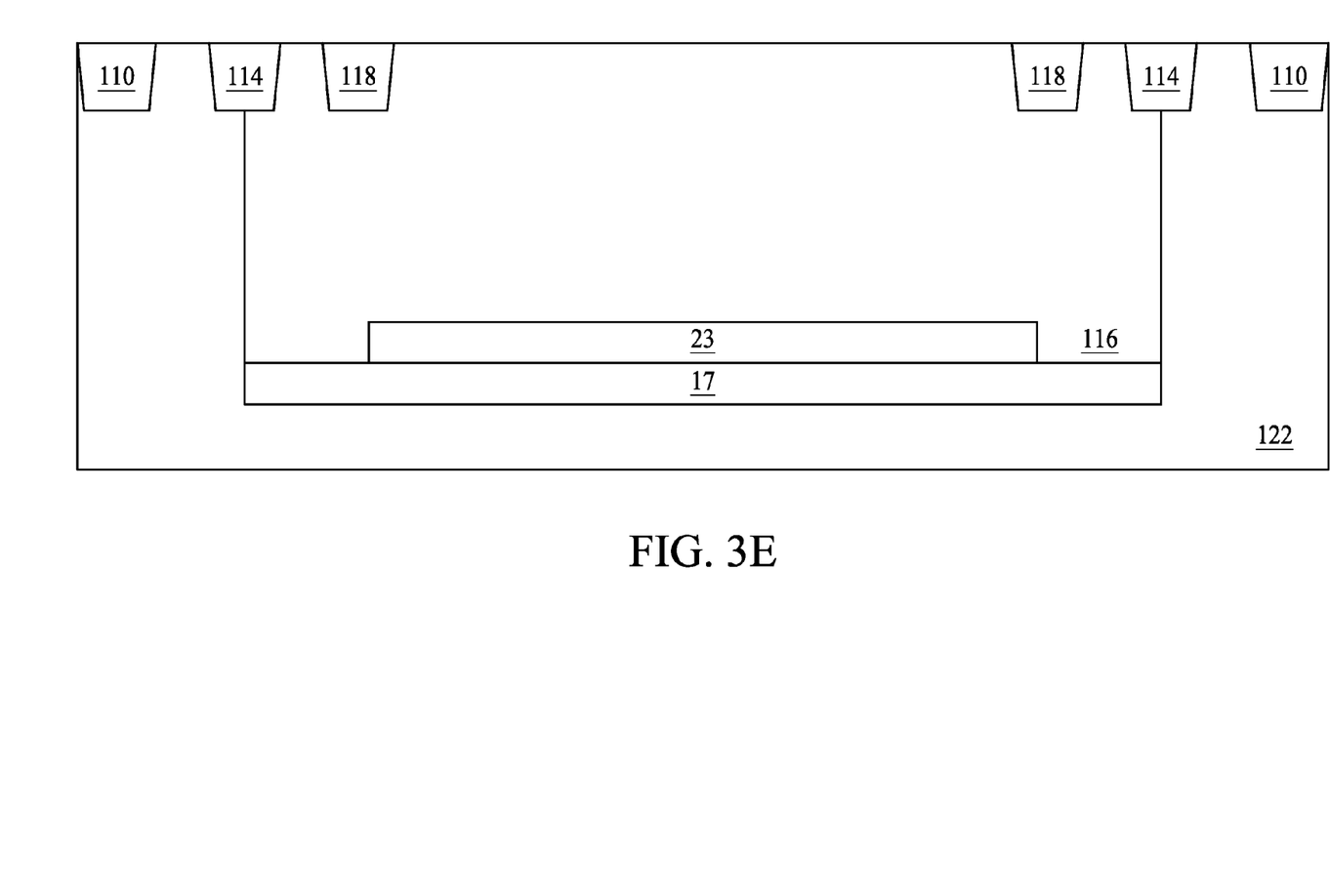

Referring to FIG. 3E, a well 116 is defined in the substrate 122 by, for example, an ion implantation process followed by a drive-in process. In particular, the implant depth is well controlled such that the well 116 contains the conductive region 23 and is substantially formed over the conductive region 17. In some embodiments, the well 116 serves as a high voltage n-well (HVNW).

Figure 3F:
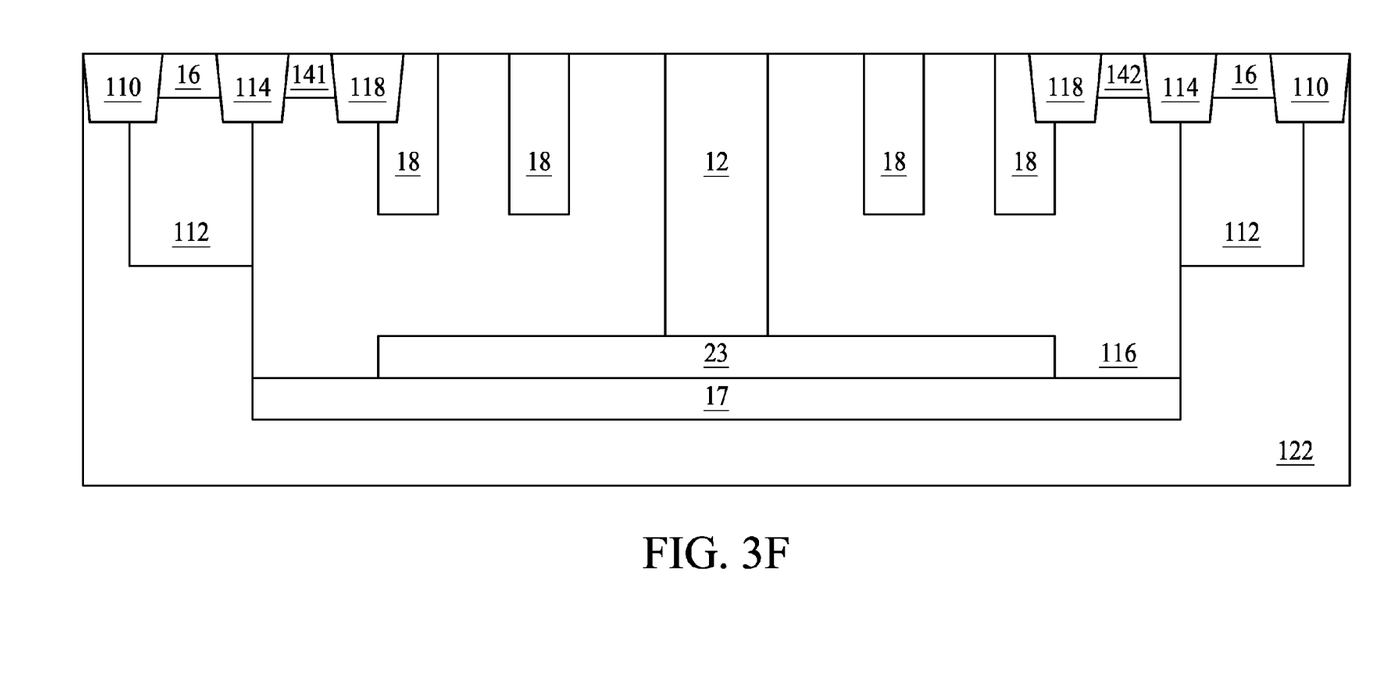

Referring to FIG. 3F, a first well region 12 is formed in the well 116 by, for example, an ion implantation process followed by a drive-in process. In particular, the implant depth is well controlled such that the first well region 12 is contiguous with the conductive region 23.

Moreover, a plurality of well regions 18 is formed in the well 116 by, for example, an ion implantation process followed by a drive-in process.

Additionally, a plurality of well regions 112 is formed in the substrate 122 by, for example, an ion implantation process followed by a drive-in process. The well regions 112 are defined between the isolation structures 114 and 110.

Furthermore, a first doped region 141 and a second doped region 142 are formed in the well 116 by, for example, an ion implantation process.

In addition, a plurality of third doped regions 16 is formed in the well regions 112 by, for example, an ion implantation process.

Figure 4:
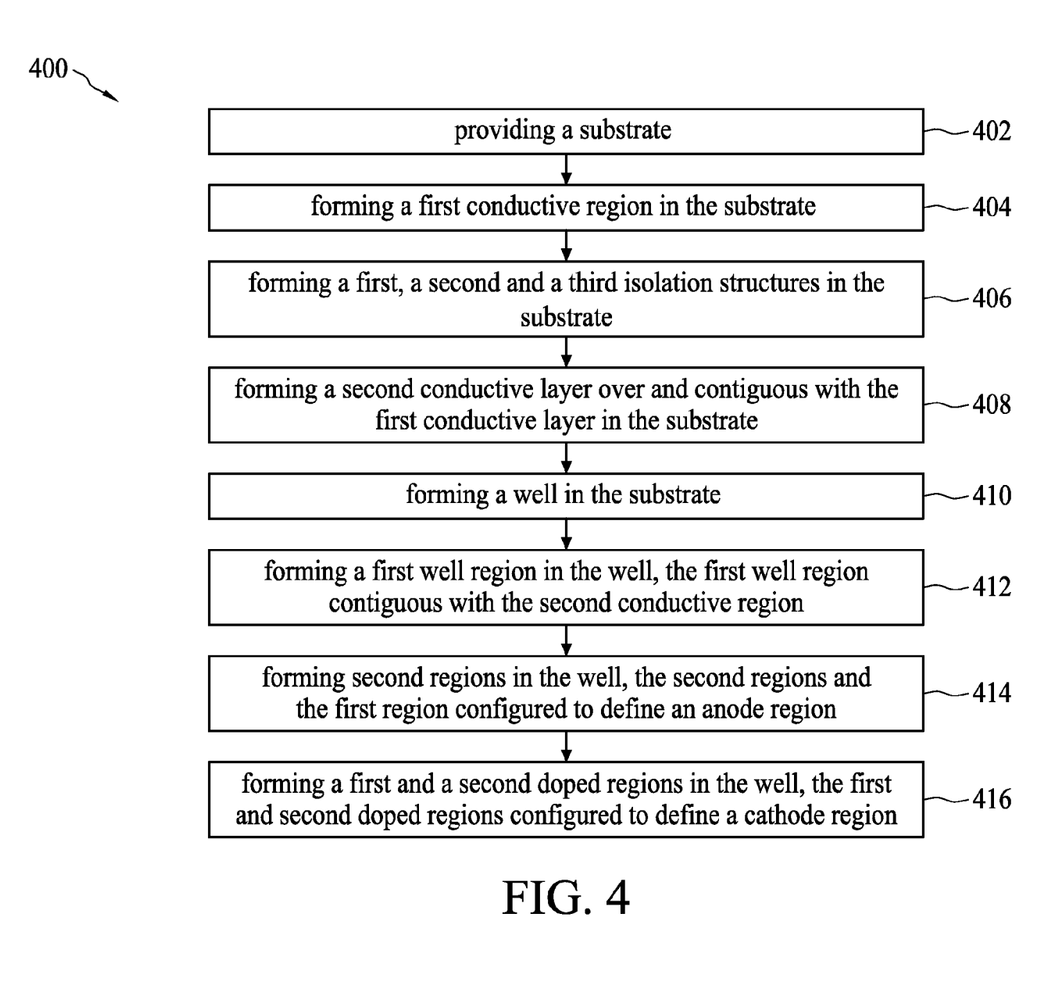
FIG. 4 is a flow diagram illustrating a method of forming a semiconductor device, in accordance with some embodiments of the present disclosure.

FIG. 4 is a flow diagram illustrating a method 400 of forming a semiconductor device, in accordance with some embodiments. Referring to FIG. 4, in operation 402, a substrate is provided. The substrate is similar to the substrate 122 described and illustrated with reference to FIG. 2.

In operation 404, a first conductive region is formed in the substrate. The first conductive region is similar to the conductive layer 17 described and illustrated with reference to FIG. 2.

In operation 406, a first, a second and a third isolation structures are formed in the substrate. The first, second and third isolation structures are similar to the isolation structures 118, 114 and 110, respectively, described and illustrated with reference to FIG. 3.

In operation 408, a second conductive region is formed over the first conductive region in the substrate. Moreover, the second conductive region is contiguous with the first conductive region, and extends under an area defined by the first isolation structure without exceeding the first isolation structure. The second conductive region is similar to the conductive region 23 described and illustrated with reference to FIG. 3.

In operation 410, a well is formed in the substrate. The well provides an active region defined by the second isolation structure. Moreover, the well contains the second conductive region and is substantially disposed over the first conductive region. The well is similar to the well 116 described and illustrated with reference to FIG. 3.

In operation 412, a first well region is formed in the well. Moreover, the first well region is contiguous with the second conductive region, and is substantially disposed at a center region of the well between the first isolation structure and the second isolation structure. The first well region is similar to the first well region 12 described and illustrated with reference to FIG. 3.

In operation 414, second well regions are formed in the well at the area defined by the first isolation structure. The second well regions may be symmetrically arranged with respect to the first well region, and are configured to define an anode region with the first well region. The second well regions are similar to the well regions 18 described and illustrated with reference to FIG. 3.

In operation 416, a first doped region and a second doped region are formed between the first isolation structure and the second isolation structure in the well. Moreover, the first and second doped regions are configured to define a cathode region. The first and second doped regions are similar to the first and second doped regions 141 and 142, respectively, described and illustrated with reference to FIG. 3.

Operations 412, 414 and 416 are interchangeable in sequential order. Alternatively, operations 412, 414 and 416 can be performed at the same time.

Some embodiments have one or a combination of the following features and/or advantages. In some embodiments, a semiconductor device is provided. The semiconductor device comprises a first well region configured to be an anode of the semiconductor device, a first doped region configured to be a cathode of the semiconductor device, a second doped region configured to be another cathode of the semiconductor device, and a conductive region. The first well region is disposed between the first doped region and the second doped region, and is configured for electrical connection of the conductive region.

In some embodiments, a semiconductor device is provided. The semiconductor device comprises a first well region configured to be an anode of the semiconductor device, a first doped region configured to be a cathode of the semiconductor device, and a conductive region disposed under the first well region and contiguous with the first well region, and configured to produce a current when the semiconductor device is forward biased.

In some embodiments, a method for making a semiconductor device is provided. The method comprises providing a substrate, forming a conductive region in the substrate, forming a well in the substrate, forming a first well region in the well to serve as an anode of the semiconductor device, the first well region configured for electrical connection of the conductive region, and forming a first doped region and a second doped region to serve as cathodes of the semiconductor device. The first well region is disposed between the first doped region and the second doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
  a first well region configured to be an anode of the semiconductor device;
  a first doped region configured to be a cathode of the semiconductor device;
  a second doped region configured to be another cathode of the semiconductor device; and
  a conductive region,
  wherein the first well region is disposed between the first doped region and the second doped region, and the first well region is configured for electrical connection of the conductive region.

2. The semiconductor device as claimed in claim 1, wherein the first well region is disposed in a first region, and the first doped region and the second doped region are disposed in a second region, the first region surrounded by the second region.

3. The semiconductor device as claimed in claim 1, wherein the first well region is disposed at a center area of the first region.

4. The semiconductor device as claimed in claim 1, wherein the conductive region is contiguous with the first well region.

5. The semiconductor device in claim 1, further comprising a well, wherein the well and first well region are configured to produce a current when the semiconductor device is forward biased.

6. The semiconductor device as claimed in claim 1, further comprising:
  a substrate;
  an isolation structure; and
  a third doped region configured for electrical connection of the substrate, and being isolated from the first doped region by the isolation structure.

7. The semiconductor device as claimed in claim 1, further comprising:
  a substrate;
  a well in the substrate, the well configured to produce a current when the semiconductor device is forwarded biased; and
  a third doped region configured for electrical connection of the substrate,
  wherein a parasitic bipolar junction transistor is defined by the well, the third doped region and the first well region.

8. The semiconductor device as claimed in claim 1, wherein the conductive region is a first conductive region, and the semiconductor device further comprises:
  a second conductive region under the first conductive region, wherein the first doped region and the second doped region are configured for electrical connection of the second conductive region.

9. The semiconductor device as claimed in claim 1, wherein a dopant type of the first well region is opposite to that of the first doped region and the second doped region.

10. The semiconductor device as claimed in claim 9, wherein the first well region includes a p-type dopant, and the first doped region includes an n-type dopant.

11. The semiconductor device as claimed in claim 1, wherein a dopant type of the first well region is the same as the conductive region.

12. A semiconductor device, comprising:
  a first well region configured to be an anode of the semiconductor device;
  a first doped region configured to be a cathode of the semiconductor device;
  a conductive region disposed under the first well region and contiguous with the first well region, configured to produce a current when the semiconductor device is forward biased; and
  a second doped region configured to be another cathode of the semiconductor device,
  wherein the conductive region extends between an area under the first doped region and the second doped region.

13. The semiconductor device as claimed in claim 12, wherein the first well region is disposed between the first doped region and the second doped region.

14. The semiconductor device as claimed in claim 12, further comprising:
  an isolation structure; and a second well region configured to produce a current when the semiconductor device is forwarded biased, and isolated from the first doped region by the isolation structure.

15. The semiconductor device as claimed in claim 12, wherein the conductive region is a first conductive region, the semiconductor device further comprising:
   a well in the substrate;
   an isolation structure;
   a second well region configured to produce a current when the semiconductor device is forward biased, and isolated from the first doped region by the isolation structure; and
   a second conductive region under the first conductive region.

16. The semiconductor device as claimed in claim 12, wherein a dopant type of the conductive region is opposite to that of the first doped region.

17. A semiconductor device, comprising:
   a well;
   a first well region, having a first depth, and configured to be an anode of the semiconductor device, disposed in the well, and produce, with the well, a current that contributes to a resultant electric current;
   a first conductive region, disposed under the first well region and contiguous with the first well region;
   a second conductive region, disposed under the first conductive region and configured to determine, with the first conductive region, a breakdown voltage of the semiconductor device;
   a first doped region, having a second depth shorter than the first depth, disposed over the first conductive region, configured to be the anode of the semiconductor device and produce, with the well, a current that contributes to the resultant electric current.

18. The semiconductor device as claimed in claim 17, further comprising:
   a first doped region configured to be a cathode of the semiconductor device; and
   a second doped region configured to be another cathode of the semiconductor device, wherein the first well region is disposed between the first doped region and the second doped region, and the first well region is configured for electrical connection of the conductive region.

19. The semiconductor device as claimed in claim 17, further comprising:
   a substrate;
   an isolation structure; and
   a third doped region configured for electrical connection of the substrate, and being isolated from the first doped region by the isolation structure.

* * * * *